United States Patent [19]

Ware

[11] 4,265,661

[45] May 5, 1981

[54] DIRECT SYNTHESIS OF INTERMETALLIC COMPOUNDS

[75] Inventor: Rowland M. Ware, Cottenham, England

[73] Assignee: Cambridge Analyzing Instruments Ltd., Hertfordshire, England

[21] Appl. No.: 77,550

[22] Filed: Sep. 21, 1979

[30] Foreign Application Priority Data

Oct. 25, 1978 [GB] United Kingdom ............... 41826/78

[51] Int. Cl.³ ...................... C01G 15/00; C01B 27/00
[52] U.S. Cl. ........................................ 75/135; 75/171; 156/616 A; 156/617 M; 423/299
[58] Field of Search .................. 75/171, 135; 423/299; 156/616 A, 617 M

[56] References Cited

U.S. PATENT DOCUMENTS

| | | | |
|---|---|---|---|
| 3,591,347 | 7/1971 | Grabmaier et al. | 23/301 |
| 3,649,192 | 3/1972 | Deyris | 23/204 R |
| 3,704,093 | 11/1972 | Haggerty et al. | 423/299 |
| 3,777,009 | 12/1973 | Menashi et al. | 423/508 |

FOREIGN PATENT DOCUMENTS

| | | |
|---|---|---|
| 49-116956 | 11/1974 | Japan ........................................ 423/299 |
| 925142 | 5/1963 | United Kingdom . |
| 925762 | 5/1963 | United Kingdom . |

OTHER PUBLICATIONS

Raab, G. et al., Siemens Forsch. U. Entwickl. Ber. 3 (3) 1974, 185.
Bachmann et al., J. Electr. Mat. 4 (2) 1975, 389.
Bass et al., J. Crystal Growth, 3,4 (1968), 286.
Mullin et al., J. Phys. Chem. Solids, 26 (1965), 782.

Primary Examiner—G. Ozaki
Assistant Examiner—Upendra Roy
Attorney, Agent, or Firm—Oblon, Fisher, Spivak, McClelland & Maier

[57] ABSTRACT

A reagent container is described formed from two hemispherical shells (10, 12) of a material which is solid below reaction temperatures (typically at room temperatures) and which will melt below the reaction temperature to form a liquid seal over the melted reagents. The container is adapted to be fitted within a crucible-like structure (16) and heated to the reaction temperature within a suitable reaction chamber (typically pressurized) so that the pressures within the reagent container can be balanced.

Other shapes of reaction container may be used such as cylindrical shapes, rectilinear shapes, and hemispherical shapes.

Where the reagents are Gallium and Phosphorus the material from which the container is formed may be Boric Oxide.

13 Claims, 4 Drawing Figures

DIRECT SYNTHESIS OF INTERMETALLIC COMPOUNDS

DESCRIPTION

Improvements in and relating to direct synthesis of inter-metallic compounds

This invention concerns methods and apparatus for synthesising inter-metallic compounds particularly those in which at least one component has a high vapour pressure at the temperature required for the reaction to take place.

BACKGROUND TO THE INVENTION

The invention is of particular application to the synthesis of compounds from at least two elements of which at least one is a metal and particularly to the group III-V and group II-VI compounds, at least one component of which has appreciable vapour pressure at temperatures at and approaching that at which reaction occurs leading to the formation of such compounds. The groups referred to are those of a periodic table according to Mendeleef.

The invention is not limited to compounds such as those described but is equally applicable to the formation of ternary and quarternary compounds, to mixed group III and V compounds as well as to group II--IV-V compounds.

With the development of light emitting diodes and infra-red transmission devices, interest has continued to develope in the formation of group III-V and group II-VI compounds such as Gallium Phosphide, Indium Phosphide, Gallium Arsenide, Zinc Selenide and Cadmium Telluride.

Many of the components of these materials have very high vapour pressures at elevated temperatures. This means that although the principal difficulties of producing single crystals from the poly crystalline materials have been largely overcome by the use of liquid encapsulated crystal growing techniques, the excessive cost of producing the poly crystalline compounds in the first place has materially hindered single crystal manufacture and use.

PRIOR ART

British patent Specification No. 1,330,914 describes and claims a method of producing a compound from at least two elements of which at least one is a metal and both or all of which exist in solid or liquid format ambient temperatures while at least one of the elements exerts an appreciable vapour pressure at the temperature at which reaction occurs to form a compound. The method involves sealing the elements with a reactionary system by means of a liquid encapsulant which is inert with respect to the system and to the reaction product at a temperature below the temperature at which the elements interact. The method further involves heating the resulted encapsulated elements to a temperature at which reaction occurs to produce the compound whilst continuously applying to the encapsulated elements and to the compound produced therefrom a gas which is inert with respect to the reactance and to the compound produced therefrom under a pressure which is at least equal to the partial pressure of the most volatile component present in the system.

Examples of encapsulant material are given as Boric Oxide, Barium Oxide and combinations of these materials with Barium Chloride or Sodium Fluoride.

The method is described in relation to the production of Gallium Arsenide and the Specification describes how the method can be applied to the formation of Gallium Phosphide and to other more complex compounds.

Whilst the method apparently works for Gallium Arsenide the Applicants have not found the method successful in relation to the production of Gallium Phosphide due to the fact that the phosphorous component of the original mixture has an appreciable vapour pressure at temperatures below the temperature at which the encapsulant material melts. In consequence it has not been found possible to form a liquid seal upon which the method described in Specification No. 1,330,914 relies before excessive quantities of the volatile component have been lost.

OBJECT OF THE INVENTION

With this in mind it is an object of the present invention to provide an improved method and apparatus for synthesising group III, V and group II, VI compounds which does not rely on the melting of a solid encapsulant material before the original mixture of ingredients have been sealed.

THE INVENTION

According to the present invention a method of forming a compound of two elements at least one of which has a high vapour pressure at the temperature required for the reaction to take place comprises the steps of forming a hollow container of solid encapsulant material, locating the compounds from which the final compound is to be formed after reaction within the hollow container, sealing the latter, placing the sealed container in a crucible in a reaction chamber and establishing a suitable reaction environment by filling the chamber with inert gas and increasing the pressure and temperature so that the sealed container first melts to form the liquid seal and thereafter with continued increasing pressure and temperature the reaction occurs between the compounds to form the desired final compound.

Preferably the crucible and contents is raised to a final temperature above that at which reaction occurs so as to obtain a complete melting of the formed compound, the melting point of which is usually above the temperature at which the constituents react to form the compound.

Preferably the sealed container is evacuated prior to sealing.

Alternatively the air may be displaced by an inert gas but this alternative procedure involves the disadvantage of gasing when the container melts with a risk that the liquid seal may be broken.

If a pulled crystal is required, a seed crystal can be introduced into the melt below the encapsulating liquid seal formed when the wall of the container melts and a crystal pulled in known manner.

The invention is of particular application to the formation of Gallium Phosphide (although the invention is not limited to this material) and where Gallium Phosphide is to be formed, the material from which the hollow container is formed is preferably Boric Oxide.

In view of the pressures involved and the need to establish a vacuum preferably the hollow container is in the form of a hollow sphere. Pressure differentials can be reduced by placing the hollow container in a controlled pressure chamber in which internal pressure is balanced by the controlled pressure in the chamber.

Where the hollow container is spherical it is preferably formed from two hemispheres which are sealed by thermal fusion after filling with the two constituents (such as Gallium and Phosphorous). Where a vacuum is required within the sealed container, the thermal fusion will be performed after evacuation of the sphere and immediate environment. Typically the thermal fusion is obtained by locally welding the two abutting edges of the two hemispheres.

Alternatively, instead of using two hemispheres a hollow spherical member is formed and provided with a small hole which can be plugged by a Boric Oxide plug after inserting the two main ingredients and evacuating the interior. If the mating surfaces of the plug and hole are suitably shaped so that a positive pressure on the outside of the sphere holds the plug in place, the latter is self-sealing and need not be welded in position. Alternatively the plug may be thermally fused by welding.

Where a self-sealing plug is used as previously described, the container is preferably located in the crucible (after being filled and evacuated) with the plug uppermost and a sensor may be situated over the plug to detect any tendency for the latter to move upwards. Control means may be provided responsive to movement detected by the sensor to control the pressure of the inert gas around the container within the reaction chamber and to increase the pressure of the inert gas around the container to maintain the necessary overpressure required to keep the plug sealed in the hole during the initial stages of heating up.

After the encapsulant has melted the temperature and pressure of the chamber are preferably programmed so that appropriate increases in temperature are simultaneously matched by appropriate increases in pressure so as to maintain the liquid seal intact.

The hollow container to which the materials for which the inter-metallic compound are to be formed may be of any convenient shape and although reference has been made to spherical shape as being preferably for extremely high pressures such as are required when dealing with Gallium Phosphide, other shaped containers such as elliptical, cylindrical and rectilinear containers may be used particularly where lower pressures are involved prior to melting down of the container.

The advantage of the invention is that unlike the method described in the aforementioned British Patent Specification, the materials from which the inter-metallic compound is to be formed are wholly contained within the solid sealed container until the material from which the latter is formed melts to form a liquid seal across the crucible containing the sealed container. It is for this reason that the crucible into which the sealed container is put should be shaped similarly to the external shape of the lower part of the sealed container so that the latter fits snugly into the crucible and so that the upper half of the sealed container which is not in contact with the crucible wall only has to deform in a generally downward direction as it melts and does not need to spread out far in order to make contact with the size of the crucible and thereby form a complete seal across the crucible below which the volatile components are trapped.

Where the crucible includes a hemispherical internal surface extending from a generally cylindrical internal surface the container is conveniently in the form of a hemispherical housing formed by a hemispherical cup and a cylindrical plate the radius of which is similar to the radius of the curvature of the hemispherical cup and the radius of the latter being the same as the radius of the hemispherical surface at the lower end of the crucible. Such a container can then be placed in the crucible with the hemispherical section in intimate contact with the hemispherical lower end of the crucible and with the cylindrical plate which seals off the interior of the hemispherical cup, and which when melted will form the liquid seal already substantially in position across the contents of the container and virtually in contact with the walls of the container.

The invention will now be described by way of example with reference to the accompanying drawings.

IN THE DRAWINGS

FIG. 1 is a cross-section through a spherical container located within a crucible in accordance with the invention.

FIG. 2 is a cross-section through a second spherical container also within a crucible but which includes a self-sealing plug also embodying the invention, FIG. 3 is a cross-section through a cylindrical container within a crucible and also embodying the invention, and FIG. 4 is a cross-section through a further container in the shape of a hemisphere also situated in a crucible and embodying the invention.

DETAILED DESCRIPTION OF DRAWINGS

Figure 1:
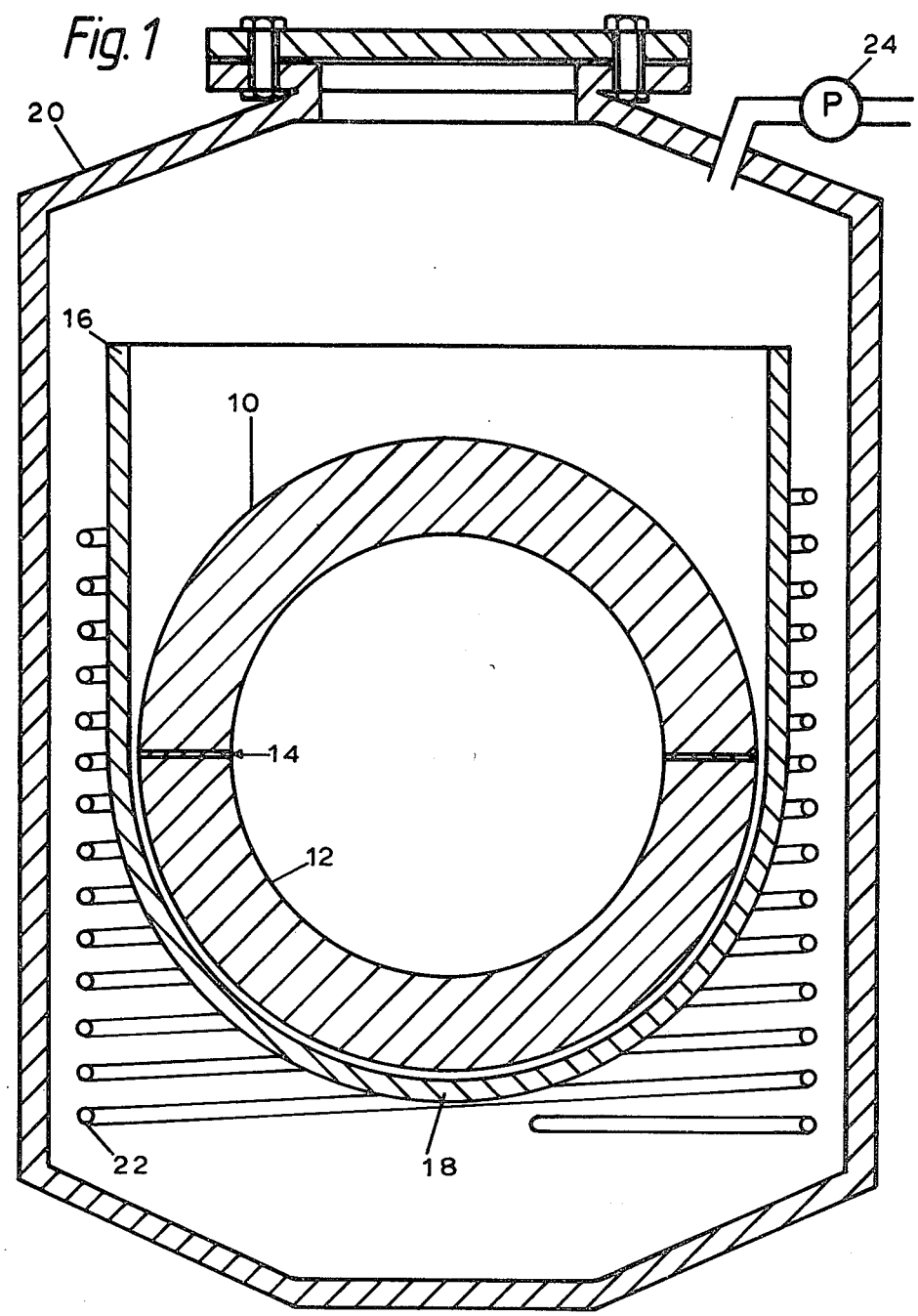

FIG. 1 illustrates a first embodiment of a sealed container formed from two hemispherical shells 10 and 12 each of Boric Oxide and which are sealed along the abutting circular edges, the line of abutment being denoted by reference numeral 14.

The sealed spherical container is situated within a cylindrical crucible 16 the internal diameter of which is similar to the diameter of the spherical shell 10, 12 and the lower end of which is closed in the form of a hemispherical end surface 18 which makes intimate contact with the lower half of the spherical shell 10, 12 when the latter is inserted into the crucible.

Prior to insertion into the crucible 16, the spherical shell formed by the two hemispherical shells 10 and 12 is partially or completely filled with ingredients which when reactive will form the desired inter-metallic compound. Thus if Gallium Phosphide is required stoichiometric quantities of Gallium and Phosphorus are placed inside the two shells and the latter evacuated and if necessary sealed by thermal fusion for example by welding around the line of abutment 14.

The filling process is most conveniently carried out by removing the upper shell 10, filling the lower shell 12 with stoichiometric quantities of the two ingredients, evacuating the environment within which the two shells are located, fitting the upper shell 10 to the lower shell 12 in the evacuated environment and by remote control or the like thermally fusing the two shells together around the line of abutment typically by means of an electric heating element.

The spherical container shown in FIG. 1 as being inserted within the crucible 16 is assumed to have been filled and sealed in this way or in a similar manner.

The crucible and the sealed and evacuated spherical container 10, 12 is situated within a growth chamber generally designated 20 which itself can be pressurized to pressure in excess of the vapor pressure of the most volatile constituent in the container 10, 12. To this end the chamber 20 is connected to a source of pressure which can be adjusted as reaction continues to compensate for the vapour pressure of the most volatile constituent.

In addition a heating coil 22 is located around a crucible 16 and within the growth chamber 20. The heating coil may either be an R F induction coil in which case the crucible 16 is preferably formed from a material which will conveniently form a susceptor within the R F field or alternatively the heating coil may be a so-called resistance coil for direct heating of the crucible and container.

The temperatures and pressures and reagants within the growth chamber 20 are such that no air should be present within the chamber. To this end the means for pressurizing the chamber 20 denoted by reference numeral 24 is in the form of a supply of inert gas which is first used to purge the chamber 20 and thereafter is pressurized within the chamber 20.

Controls are provided (not shown) for increasing the temperature of the crucible and container by supplying appropriate electric currents to the coil 22 and simultaneously increasing the pressure of the gas within the chamber 20. The pressure of the gas is controlled so as to always be greater than the expected pressure of the most volatile constituent within the container 10, 12 so that there is a positive pressure keeping the spherical container sealed at all times.

As the temperature is raised so the material from which the container is formed begins to melt and flow so as to encapsulate the stoichiometric quantities of the main reactants and form a liquid seal thereover.

Once the liquid seal has been established, the temperature and pressure is further increased until the reaction temperature is reached at which the materials within the encapsulant material react to form the final product.

The temperature and pressure (if required) is further increased to ensure the final material is itself melted after this stage has been reached, the temperature and pressure can be progressively reduced and/or a single crystal pulled from the melt by taking a seed crystal into the melt through the encapsulating layer and pulling the crystal in known manner.

Figure 2:
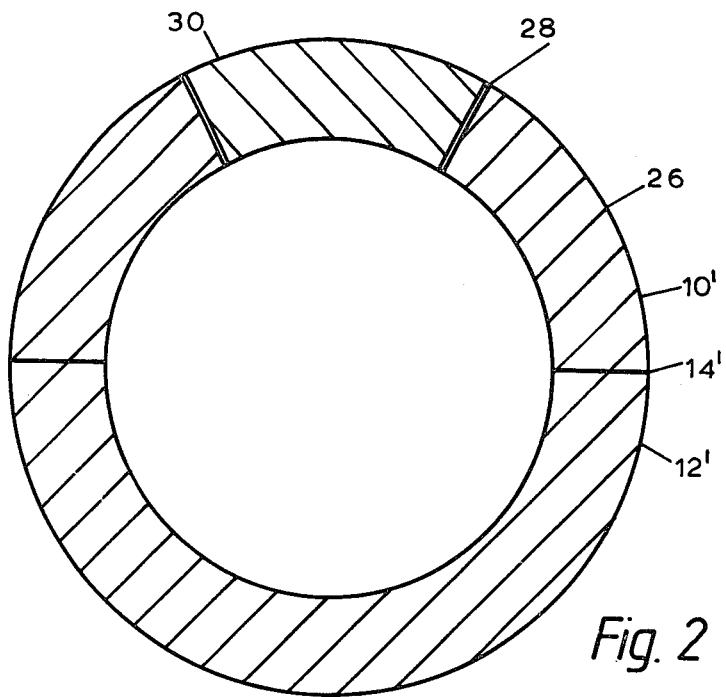

FIG. 2 illustrates an alternative and preferred form of the spherical container denoted by reference numeral 10 in FIG. 1. The container shown in FIG. 2 is denoted by reference numeral 26 and is typically formed from two hemispherical shells of a material such as Boric Oxide which are sealed together around the abutting junction of the two hemispherical shells. Access to the interior of the spherical container is gained through a small circular aperture at the top of the shell denoted by reference numeral 28. The aperture is closed by a plug of the same material from which the remainder of the container is formed and which is shaped so that when in place the spherical shape is continued both internally and externally. The plug is denoted by reference numeral 30 and where the aperture 28 is formed by sawing the wall of the spherical shell the plug 30 may be formed from the wedge of material removed by the saw cut.

In use the container 26 shown in FIG. 2 is handled in a similar manner as that outlined with regard to FIG. 1. However the step of sealing the two hemispherical shells to form the spherical member does not have to be formed with the volatile ingredients within the container and instead can form part of the manufacturing process of making the container in the first place whilst empty.

The method of use involves filling the spherical container through the aperture 28 with the stoichiometric quantities of the ingredients to be formed into the intermetallic compound, placing the filled container in a vacuum chamber with provision for remotely controlling and positioning the plug member 30 in the chamber. After evacuating the chamber, the plug 30 is positioned in the aperture 28 after which the vacuum chamber is pressurized, the external over-pressure firmly holding the plug 30 in place.

Preferably the plug 30 is lightly ground into the aperture 28 before the device is inserted in the vacuum chamber so that when the plug 30 is positioned in the aperture 28 in the vacuum chamber, a reliable vacuum tight seal is formed between the plug and the wall of the aperture 28. Alternatively the plug may be welded in place.

The evacuated container 26 is now put into a crucible in a growth chamber which may of course be the vacuum chamber and the growth chamber pressurized with an appropriate over-pressure and the crucible and container heated as previously described, the heating involving two stages first the melting of the wall of the container 26 so as to form the liquid seal around the stoichiometric quantities of the ingredients and subsequent heating and increasing of the over-pressure to contain the vapor pressure of the more volatile constituent below the liquid seal until the appropriate reaction has taken place and the desired intermetallic compound has been formed.

The advantage of the embodiment shown in FIG. 2 over that shown in FIG. 1 is that the plug 30 is self-sealing and no welding or other form of bonding is required between the two shells at least after the container has been filled with the ingredients. This is of particular value where one of the ingredients is excessively volatile even at low temperatures.

A further advantage of the arrangement shown in FIG. 2 over that shown in FIG. 1 is that virtually the whole of the interior of the spherical shell 26 can be filled with the stoichiometric quantities of the ingredients to form the inter-metallic compound whereas in FIG. 1 embodiment it is difficult to arrange for more than half the spherical interior of the shell to be filled.

The arrangements shown in FIGS. 1 and 2 are primarily intended to serve as containers for ingredients in which one is excessively volatile such as phosphorus and will therefore have to withstand very considerable over-pressures, unless the pressure within is balanced by an equal pressure without the container.

Figure 3:
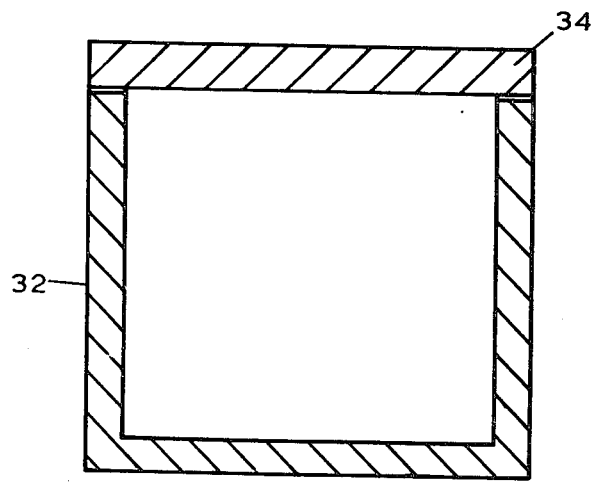
Figure 4:
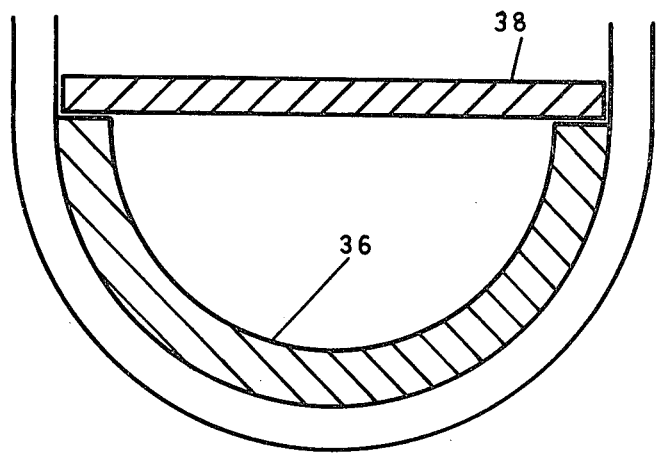

The embodiments shown in FIGS. 3 and 4 may be simpler to construct but because of their design will not withstand the same levels of over-pressure which spherical shapes of FIGS. 1 and 2 will, unless pressure balancing is employed.

FIG. 3 shows a cylindrical container in which the stoichiometric quantities of the two or more ingredients are sealed in the cylindrical shell 32 by means of a flat circular end cap 34 which is secured in position over the open end of the cylindrical container 32 and is preferably thermally fused in position.

Where the interior is to be evacuated as described with reference to FIGS. 1 and 2, the underside of the plate 34 may be slightly ground onto the upper annular edge of the container 32 so that the filled container 32 can be placed in a vacuum chamber and by remote control, after evacuation of the chamber the lid 34 can be placed in position, the vacuum within the now sealed container formed by the two parts 32 and 34 retaining the lid 34 in position after the vacuum chamber has been pressurized.

The embodiment shown in FIG. 3 is used in practice in exactly the same way as the device shown in FIG. 2 and allows the use of a cylindrical crucible where appropriate which may be simpler to construct than the part hemispherical crucible described in relation to FIG. 1.

FIG. 4 illustrates a spherical container formed from a hemispherical shell 36 and a flat circular lid 38. The advantage of the hemispherical container over the spherical container shown in FIG. 1 is that the whole of the interior can be filled with the stoichiometric quantities of the two or more ingredients more readily than the spherical container formed by shell 10 and 12 of FIG. 1. However the flat plate 38 reduces the overpressure which the filled and sealed container can withstand and like the embodiment shown in FIG. 3, the hemispherical container is essentially for relatively low pressure use.

The container is filled in the same way as described with reference to FIG. 3 and the hemispherical shell 36 is first filled with the stoichiometric quantities of the two or more ingredients and if the lid 38 is a sealing fit (by having lightly ground onto the upper annular edge of the hemispherical bowl 36) the lid can be positioned over the filled hemispherical bowl in an evacuated enclosure as previously described using remote control within the evacuated enclosure after which the seal between the lid 38 and the hemispherical bowl 36 is maintained by the over-pressure surrounding the now closed container when the external vacuum is removed.

Figure 4A:
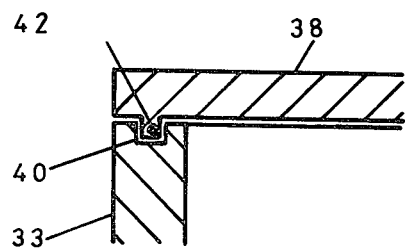

In order to improve the sealing between the two sections of the container such as shown in FIGS. 1, 3 and 4 the mating surfaces may be machined or otherwise formed as shown in FIG. 4a so as to have an annular slot 40 formed for example in the upper peripheral edge of the one member and a co-operating annular rim 42 in the co-operating edge or underside of the plate of the second part of the enclosure. FIG. 4a is intended to relate specifically to FIG. 4 and to this end the member containing the slot 40 is denoted by reference numeral 36 and the member containing the annular inter-fitting abutment 42 is denoted by reference numeral 38. However it will be seen that the same modification can be incorporated in each of the embodiments shown in FIGS. 1 and 3 in a similar manner.

FIG. 4a is intended only to be exemplary of one of the possible modifications to improve the sealing characteristics of the join between the two mating surfaces. Provision of two or more such slots and inter-fitting lips or abutments will further improve the seal.

The conditions under which the containers are to operate are indicated below in the following examples which define the conditions required for the formation of four typical intermetallic compounds.

1. Formation of Gallium Arsenide.

The temperature at which Gallium and Arsenic will react to form Gallium Arsenide is around 800° centigrade. The resulting product is in a solid form and after the Gallium and Arsenic have been fully converted the temperature is raised to approximately 1280° centigrade which is the melting point of Gallium Arsenide so as to ensure complete reaction has occurred.

2. Formation of Gallium Phosphide

It is believed that the temperature at which Gallium and Phosphorus react to form Gallium Phosphide is 595° centigrade. As with Gallium Arsenide, the formed material is then heated further to approximately 1465° centigrade which is the approximate melting point of Gallium Phosphide so as to ensure complete reaction has occurred.

3. Indium Phosphide.

It is believed that the temperature at which the reaction occurs between Indium and Phosphorus to form Indium Phosphide is similar to that of Gallium Phosphide but the melting point of Indium Phosphide is only about 1060° centigrade.

4. Formation of Lead Telluride

The temperature at which reaction between Lead and Tellurium react to form Telluride is about 350° centigrade and the melting point of P6Te is 917° centigrade.

The above temperatures should be compared with the temperature at which the material from which the container is formed and it will be seen that Boric Oxide ($B_2O_3$) is a suitable material for the formation of all the above mentioned inter-metallic compounds since its melting point is in the region of 450°–500° centigrade. However it is to be understood that the invention is not limited to the use of Boric Oxide and any suitable encapsulating material may be used provided it is solid at room temperatures so that the shells and/or color plates or plugs of the various embodiments can be formed either by machining or casting or otherwise and fitted together so as to contain the stoichiometric quantities of the materials which are to be reacted together to form the intermetallic compound.

I claim

1. In a process of forming a compound of two elements at least one of which has a high vapor pressure at the required reaction temperature comprising:
   placing the elements in a suitable vessel together with a solid encapsulant material which will melt at a temperature below the temperature at which reaction occurs between the elements;
   increasing the temperature and pressure so that the solid encapsulant melts to form a liquid seal over the elements; and,
   further increasing the temperature and pressure to cause a reaction between the elements thus forming the desired compound,
   the improvement which comprises providing a hollow container of the solid encapsulant material, sealing the elements in the container, and placing the sealed contained into the vesel.

2. The process of claim 1, wherein the process further includes increasing the temperature of the vessel and contents above that at which the said reaction occurs to a final temperature above the melting point of the said compound.

3. The process of claim 1, wherein the container is evacuated prior to sealing.

4. The process of claim 1, wherein any air in the container is displaced by an inert gas prior to sealing.

5. The process of claim 1, wherein, after the desired compound has been formed, a seed crystal is introduced into the melt below the encapsuling liquid seal, and a crystal is pulled from the melt.

6. The process of claim 1, wherein the compound to be formed is Gallium Phosphide and the solid encapsulant material is boric oxide.

7. Apparatus for performing the process of claim 1 comprising:
   (1) a hollow container formed from solid encapsulant material;
   (2) means for sealing the container after the elements have been placed therein;
   (3) a suitable vessel for receiving the sealed container;
   (4) a reaction chamber for receiving the vessel;
   (5) means for heating at least the vessel and hollow container within the reaction chamber; and
   (6) means for increasing the pressure within the reaction chamber.

8. Apparatus according to claim 7, wherein the hollow container is a hollow sphere.

9. Apparatus according to claim 8, wherein the hollow container is formed from two hemispheres and the sealing means includes means for sealing the hemispheres by thermal fusion.

10. Apparatus according to claim 7 further including means for evacuating the sealed container.

11. Apparatus according to claim 8, wherein the container has a small hole, the apparatus further including means for evacuating the container and a plug of similar material to that from which the hollow container is made for closing the hole after insertion of the elements and evacuation of the container therethrough.

12. Apparatus according to claim 11, wherein the mating surfaces of the plug and the hole are shaped such that a positive pressure on the outside of the sphere holds the plug in place thereby rendering the plug self-sealing.

13. Apparatus according to claim 7, wherein the interior of the vessel is shaped similarly to the external shape of the lower portion of the hollow container so that the container fits snugly into the vessel.

* * * * *